US011054260B2

(12) United States Patent
Jomori

(10) Patent No.: US 11,054,260 B2
(45) Date of Patent: Jul. 6, 2021

(54) VIBRATION TYPE ANGULAR VELOCITY SENSOR

(71) Applicant: DENSO CORPORATION, Kariya (JP)

(72) Inventor: Tomoya Jomori, Kariya (JP)

(73) Assignee: DENSO CORPORATION, Kariya (JP)

( * ) Notice: Subject to any disclaimer, the term of this patent is extended or adjusted under 35 U.S.C. 154(b) by 56 days.

(21) Appl. No.: 16/708,668

(22) Filed: Dec. 10, 2019

(65) Prior Publication Data

US 2020/0263991 A1   Aug. 20, 2020

Related U.S. Application Data

(63) Continuation of application No. PCT/JP2018/022727, filed on Jun. 14, 2018.

(30) Foreign Application Priority Data

Jun. 22, 2017   (JP) .............................. JP2017-122283

(51) Int. Cl.
*G01C 19/5747*   (2012.01)
*H01L 41/08*   (2006.01)
*H01L 41/187*   (2006.01)

(52) U.S. Cl.
CPC ...... *G01C 19/5747* (2013.01); *H01L 41/0825* (2013.01); *H01L 41/1876* (2013.01)

(58) Field of Classification Search
CPC ................................................ G01C 19/5747
See application file for complete search history.

(56) References Cited

U.S. PATENT DOCUMENTS

| 2003/0131664 | A1 | 7/2003 | Mochida et al. |
| 2013/0180332 | A1* | 7/2013 | Jia ...................... G01C 19/5762 73/504.12 |
| 2013/0270659 | A1 | 10/2013 | Jomori et al. |
| 2014/0360265 | A1 | 12/2014 | Jomori et al. |
| 2015/0168437 | A1 | 6/2015 | Jomori et al. |
| 2015/0308828 | A1 | 10/2015 | Jomori et al. |

FOREIGN PATENT DOCUMENTS

JP   2013-181861 A   9/2013

\* cited by examiner

*Primary Examiner* — Walter L Lindsay, Jr.
*Assistant Examiner* — Andrew V Do
(74) *Attorney, Agent, or Firm* — Posz Law Group, PLC

(57) ABSTRACT

A vibration type angular velocity sensor includes a substrate having a surface; a plurality of fixation parts, a plurality of weights, two linear drive beams, a plurality of supporting members, a drive part and a detection part. The two linear drive beams are disposed on opposite sides of the weights in one direction so as to be connected to each other through the weights. The supporting members join the fixation parts to the drive beams. The drive part drives the drive beams to vibrate. The detection part generates an electric output according to displacement of the weights caused by an angular velocity applied thereto while the drive beams are being driven to vibrate. The fixation parts are disposed between the two linear drive beams.

6 Claims, 5 Drawing Sheets

US 11,054,260 B2

VIBRATION TYPE ANGULAR VELOCITY SENSOR

CROSS REFERENCE TO RELATED APPLICATIONS

The present application is a continuation application of International Patent Application No. PCT/JP2018/022727 filed on Jun. 14, 2018, which designated the U.S. and claims the benefit of priority from Japanese Patent Application No. 2017-122283 filed on Jun. 22, 2017. The entire disclosures of all of the above applications are incorporated herein by reference.

TECHNICAL FIELD

The present disclosure relates to a vibration type angular velocity sensor that detects an angular velocity applied thereto based on displacement of detection weights caused in accordance with the application of the angular velocity.

BACKGROUND

There is a vibration type angular velocity sensor in which detection weights supported by springs are displaced in response to an application of an angular velocity thereto and which detects, based on the displacement of the detection weights, the applied angular velocity from an amount of the displacement. For example, the vibration type angular velocity sensor has drive weights which are each caused to vibrate in a planar direction of a substrate and the detection weights connected to the drive weights via the detection springs. The vibration type angular velocity sensor drives each of the drive weights to vibrate in a predetermined direction. The vibration type angular velocity sensor detects an angular velocity based on vibration of the detection weights in directions crossing the direction of drive-vibrations, caused during an application of the angular velocity to the vibration type angular velocity sensor.

SUMMARY

The present disclosure describes a vibration type angular velocity sensor including a substrate having a surface; a plurality of fixation parts, a plurality of weights, two linear drive beams, a plurality of supporting members, a drive part and a detection part. The fixation parts are disposed on the surface of the substrate. The weights are disposed to be spaced apart from the surface of the substrate and disposed above the surface of the substrate to be spaced apart from each other. The two linear drive beams are disposed above the surface of the substrate to be spaced apart from the surface of the substrate. The two linear drive beams are disposed on opposite sides of the weights in one direction so as to be connected to each other through the weights. The supporting members join the fixation parts to the drive beams. The drive part drives the drive beams to vibrate. The detection part generates an electric output according to displacement of the weights caused by an angular velocity applied thereto while the drive beams are being driven to vibrate. The fixation parts are disposed between the two linear drive beams.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
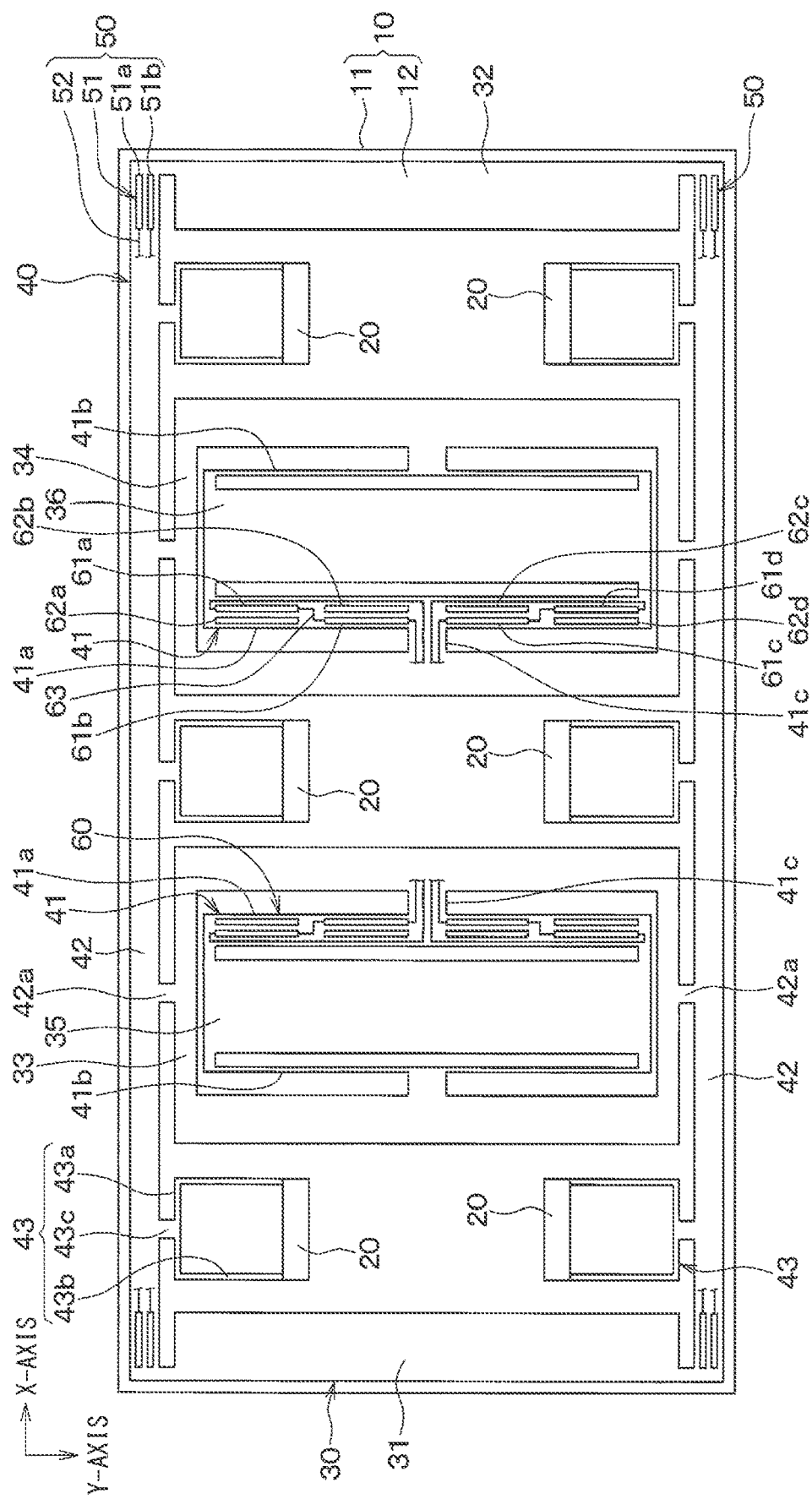
FIG. 1 is a schematic plan view showing a vibration type angular velocity sensor of a first embodiment.

For example, a vibration type angular velocity sensor has detection weights that are supported by springs and are displaced in response to an application of an angular velocity to the vibration type angular velocity sensor. The vibration type angular velocity sensor detects, based on the displacement of the detection weights, the applied angular velocity from an amount of the displacement.

For example, the vibration type angular velocity sensor has drive weights which are each caused to vibrate in a planar direction of a substrate and the detection weights connected to the drive weights via the detection springs. The vibration type angular velocity sensor drives each of the drive weights to vibrate in a predetermined direction. The vibration type angular velocity sensor detects an angular velocity based on vibration of the detection weights in directions crossing the direction of drive-vibrations, caused during an application of the angular velocity to the vibration type angular velocity sensor.

Such a vibration type angular velocity sensor may further include two drive beams connected to each other through the drive weights, and fixation parts supporting the drive beams via supporting members and fixed to the substrate. The fixation parts may be provided to support the drive weights or the like with respect to the substrate. The plurality of fixation parts may be formed on the substrate and respectively connected to the two drive beams via the respective supporting members.

When a strain is caused in the substrate by heat or the like, the fixation parts may be displaced by the strain, and the displacement of the fixation parts may be undesirably transmitted to the drive weights and the detection weights via the supporting members and the drive beams. As a result, in addition to the Coriolis' force resulting from the application of the angular velocity, the displacement of the fixation parts resulting from the strain in the substrate may be transmitted to the drive weights or the like, so temperature characteristics may be degraded and detection accuracy of the angular velocity may be degraded.

In a structure where the fixation parts are disposed outside the drive weights in a top view, the displacement of the fixation parts resulting from the strain in the substrate may be large, and the strain in the substrate may affect the detection accuracy of the angular velocity.

The present disclosure provides a vibration type angular velocity sensor which can successfully suppress degradation of detection accuracy of an angular velocity due to the strain in the substrate, and has improved vibration damping performance and improved robustness against the strain in the substrate.

A vibration type angular velocity sensor according to a first aspect of the present disclosure includes a substrate having a surface, a plurality of fixation parts, a plurality of weights, two linear drive beams, a plurality of supporting members, a drive part and a detection part. The fixation parts are disposed on the surface of the substrate. The weights are disposed above the surface of the substrate to be spaced apart from the surface of the substrate and disposed to be spaced apart from each other. The two linear drive beams are disposed above the surface of the substrate to be spaced apart from the substrate. The two linear drive beams are disposed on opposite sides of the weights in one direction, and connected to each other through the weights. The supporting members join the fixation parts to the drive beams. The drive part drives to vibrate the drive beams. The detection part generates an electric output according to displacement of the weights caused by an angular velocity applied thereto while the drive beams are being driven to vibrate. The weights include a pair of detection weights, a pair of inner drive weights each surrounding a periphery of corresponding one of the detection weights and joined to the detection weight, and a pair of outer drive weights disposed on opposite sides of the pair of inner drive weights. The fixation parts are located between the two drive beams when viewed in a direction normal to the one surface, while being disposed between the inner drive weights and between the inner drive weights and the outer drive weights.

In such a configuration, even when heat or the like causes a strain in the substrate, the fixation parts are disposed in a region between the two drive beams, i.e., in a region adjacent to a center of the substrate where the strain in the substrate is smaller than in an outer peripheral portion of the substrate. Consequently, the displacement of each of the fixation parts resulting from the strain in the substrate is smaller than in a vibration type angular velocity sensor in which the fixation parts are disposed outside the two drive beams. The vibration type angular velocity sensor having the structure in which the fixation parts are disposed outside the two drive beams may also be hereinafter referred to simply as the "conventional sensor".

In the vibration type angular velocity sensor according to the above described aspect of the present disclosure, the degradation of the accuracy of detection of the angular velocity due to the strain in the substrate is more successfully suppressed and which has improved vibration damping performance and improved robustness against the strain in the substrate.

The following will describe embodiments of the present disclosure based on drawings. Note that, in the following description of the individual embodiments, like or equivalent component parts are given like reference characters or numerals.

First Embodiment

A description will be given of a vibration type angular velocity sensor of the first embodiment, which is a so-called gyroscope sensor.

The vibration type angular velocity sensor of the present embodiment is configured to detect an angular velocity and used for, e.g., detection of a rotational angular velocity around a center line parallel with a vertical direction of a vehicle but, needless to say, the vibration type angular velocity sensor of the present embodiment can also be applied to a non-vehicular use.

FIG. 1 is a schematic plan view of the vibration type angular velocity sensor of the present embodiment. The vibration type angular velocity sensor is mounted in the vehicle such that a direction normal to a surface of a paper sheet with FIG. 1 coincides with the vertical direction of the vehicle.

The vibration type angular velocity sensor is formed on one surface side of a plate-shaped substrate 10. The substrate 10 is formed of a SOI (Silicon on insulator) substrate having a structure in which a buried oxide film serving as a sacrificial layer and not shown is interposed between a supporting substrate 11 and a semiconductor layer 12. Such a sensor structure is formed by etching the semiconductor layer 12 into a pattern of the sensor structure and then partially removing the buried oxide film to provide a state in which the sensor structure is partially released.

Note that the following description will be given on the assumption that one direction in a plane parallel with a top surface of the semiconductor layer 12 and corresponding to a lateral direction along the surface of the paper sheet is an x-axis direction, a vertical direction along the surface of the paper sheet which is perpendicular to the x-axis direction is a y-axis direction, and a direction perpendicular to one surface of the semiconductor layer 12 is a z-axis direction. Also, in the present embodiment, a description will be given of an example in which the y-axis direction corresponds to one direction of each of a plurality of weights 31 to 36 described later and the x-axis direction corresponds to a direction perpendicular to the one direction.

The semiconductor layer 12 is patterned into fixation parts 20, a movable part 30, and a beam part 40. Each of the fixation parts 20 has the buried oxide film remaining on at least a portion of a back surface thereof. The fixation part 20 is in a state fixed to the supporting substrate 11 via the buried oxide film without being released from the supporting substrate 11. The movable part 30 and the beam part 40 form a vibrator in the vibration type angular velocity sensor. From a back surface of the movable part 30, the buried oxide film has been removed to bring the movable part 30 into a state released from the supporting substrate 11. The beam part 40 is configured to support the movable part 30 and displace the movable part 30 in the x-axis direction and in the y-axis direction so as to effect angular velocity detection. Specific structures of the fixation parts 20, the movable part 30, and the beam part 40 will be described.

The fixation parts 20 function as supporting fixation parts for supporting the movable part 30. As shown in FIG. 1, the fixation parts 20 are disposed in, e.g., a region between two drive beams 42 described later in top view to support the movable parts 30 at six positions via the beam part 40. A specific layout of the fixation parts 20 and an effect achieved thereby will be described after a layout of the entire sensor structure is described.

As shown in FIG. 1, in the example described herein, as the supporting fixation part, only the fixation parts 20 are provided. However, the gyroscope sensor of the present embodiment may also have a structure additionally including another fixation part such as a pad fixation part not shown on which a pad or the like is formed.

The movable part 30 is a part displaced in response to an application of an angular velocity, and is configured to include the plurality of weights 31 to 36, i.e., the outer drive weights 31 and 32, the inner drive weights 33 and 34, and the detection weights 35 and 36. The movable part 30 has a layout in which the outer drive weight 31, the inner drive weight 33 including the detection weight 35, the inner drive weight 34 including the detection weight 36, and the outer drive weight 32 are arranged in this order along the x-axis direction. In other words, the movable part 30 has a structure in which the two inner drive weights 33 and 34 having the respective detection weights 35 and 36 provided therein are arranged on an inner side, while the outer drive weights 31 and 32 are individually disposed on both outer sides of the two inner drive weights 33 and 34 such that the two inner drive weights 33 and 34 are interposed therebetween.

The outer drive weights 31 and 32 are provided to extend in the y-axis direction. The outer drive weight 31 is disposed to face the inner drive weight 33, while the outer drive weight 32 is disposed to face the inner drive weight 34. Each of the outer drive weights 31 and 32 functions as a mass portion having a width larger than that of each of various beams included in the beam part 40, which is movable in the y-axis direction when vibrational driving for detection is performed.

Each of the inner drive weights 33 and 34 is in the form of a frame body having a quadrilateral shape. Each of the inner drive weights 33 and 34 functions as a mass portion having a width larger than that of each of the various beams included in the beam part 40, which is movable in the y-axis direction. Each of the inner drive weights 33 and 34 formed to have a quadrilateral shape has two sides facing each other and parallel with the x-axis direction, while having the other two sides facing each other and parallel with the y-axis direction. One of the two sides of each of the inner drive weights 33 and 34 which are parallel with the y-axis direction is disposed to face the outer drive weight 31 or 32, while the other of the two sides of the inner drive weight 33 or 34 which are parallel with the y-axis direction faces the other inner drive weight 34 or 33.

Each of the detection weights 35 and 36 has a quadrilateral shape. The detection weights 35 and 36 are supported by respective inner wall surfaces of the inner drive weights 33 and 34 via detection beams 41 of the beam part 40 described later. Each of the detection weights 35 and 36 also functions as a mass portion, which is moved, together with the inner drive weight 33 or 34, in the y-axis direction by vibrational driving, while being moved in the x-axis direction during the application of the angular velocity.

The beam part 40 is configured to have the detection beams 41, the drive beams 42, and supporting members 43.

The detection beams 41 connect respective sides of the inner wall surfaces of the inner drive weights 33 and 34 which are parallel with the y-axis direction and respective sides of outer wall surfaces of the detection weights 35 and 36 which are parallel with the y-axis direction. In the case of the present embodiment, the detection beams 41 are configured as beams having two-end supporting structures which support the detection weights 35 and 36, while being displaced from each other in the x-axis direction. More specifically, the detection beams 41 are disposed on both sides of each of the detection weights 35 and 36 in the x-axis direction. One of the detection beams 41 serves as a first detection beam 41a, while the other detection beam 41 serves as a second detection beam 41b. The detection beams 41 are structured to support the detection weights 35 and 36 on both sides in the x-axis direction. Both of the first detection beams 41a and the second detection beams 41b have respective middle portions in the y-axis direction as joint parts 41c and are connected to respective inner walls of the inner drive weights 33 and 34 by the joint parts 41c. The detection beams 41 support the respective both ends of the detection weights 35 and 36 in the y-axis direction on both sides of the joint parts 41c located at middle positions.

In such a configuration, since the detection beams 41 have respective shapes along the y-axis direction, the detection beams 41 can be displaced in the x-axis direction. The displacement of the detection beams 41 in the x-axis direction allows the detection weights 35 and 36 to be moved in the x-axis direction.

In addition, respective spring constants of the first detection beams 41a and the second detection beams 41b have different values. In the case of the present embodiment, the first detection beams 41a and the second detection beams 41b, which are formed by patterning the semiconductor layer 12, are formed of the same material. Accordingly, respective dimensions of the first detection beams 41a and the second detection beams 41b in the x-axis direction are differentiated from each other. The first and second detection beam 41a and 41b are thus configured to have the spring constants having the different values.

More specifically, respective inner sides of the detection weights 35 and 36, i.e., the side of the detection weight 35 closer to the detection weight 36 and the side of the detection weight 36 closer to the detection weight 35 are configured as the first detection beams 41a, while the opposite sides thereof are configured as the second detection beams 41b. Each of the first detection beams 41a has the dimension in the x-axis direction which is set larger than that of each of the second detection beams 41b to have the spring constant having a larger value.

The drive beams 42 join the outer drive weights 31 and 32 and the inner drive weights 33 and 34 together and also allow the outer drive weights 31 and 32 and the inner drive weights 33 and 34 to move in the y-axis direction. The outer drive weight 31 as one of the outer drive weights, the inner drive weight 33 as one of the inner drive weights, the inner drive weight 34 as the other of the inner drive weights, and the outer drive weight 32 as the other of the outer drive weights are joined together by the drive beams 42, while being arranged in this order.

Specifically, each of the drive beams 42 is a linear beam having a predetermined widthwise dimension in the y-axis direction. The drive beams 42 are individually disposed on both sides of the outer drive weights 31 and 32 and the inner drive weights 33 and 34, which are interposed therebetween, in the one direction of each of the plurality of weights 31 to 36, i.e., in the y-axis direction in FIG. 1. In other words, the drive beams 42 are individually disposed on one end side and the other end side of each of the plurality of weights 31 to 36 in the one direction thereof such that the plurality of weights 31 to 36 are interposed therebetween. Each of the drive beams 42 is connected to the outer drive weights 31 and 32 and to the inner drive weights 33 and 34. Each of the drive beams 42 may appropriately be connected directly to the outer drive weights 31 and 32 and to the inner drive weights 33 and 34 but, in the present embodiment, for example, each of the drive beams 42 is connected to the inner drive weights 33 and 34 via joint parts 42a.

The supporting members 43 support the outer drive weights 31 and 32, the inner drive weights 33 and 34, and the detection weights 35 and 36. Specifically, the supporting members 43 are provided between the fixation parts 20 and the drive beams 42 to support the respective weights 31 to 36 described above with respect to the fixation parts 20 via the drive beams 42.

Each of the supporting members 43 is configured to have a rotating beam 43a, a supporting beam 43b, and a joint part 43c. The rotating beam 43a is a linear beam having a predetermined widthwise dimension in the y-axis direction and having both ends connected to the supporting beams 43b. To a middle portion of the rotating beam 43a in the x-axis direction, the joint part 43c is connected. When the sensor is driven, the rotating beam 43a is bent serpentinely around the joint part 43c into an S-shaped configuration. The supporting beam 43b is configured to connect the both ends of the rotating beam 43a to the fixation part 20 and configured as a linear member in the present embodiment. The supporting beam 43b also functions to allow each of the weights 31 to 36 to move in the x-axis direction when an impact or the like is applied thereto. The joint part 43c functions to connect the supporting member 43 to the drive beam 42.

Note that, as shown in FIG. 1, in each of the supporting members 43 of the present embodiment, a dimension of the joint part 43c in the y-axis direction is set shorter than a dimension of the supporting beam 43b in the y-axis direction, and a dimension of the rotating beam 43a in the y-axis direction is set shorter than a dimension of the joint part 43c in the x-axis direction. However, the dimensions and the shapes of the individual components of each of the supporting members 43 are not limited to those in the example described above, and design of the supporting member 43 may also be modified as necessary.

The vibration type angular velocity sensor further includes drive parts 50 and detection parts 60.

The drive parts 50 are configured to drive the sensor structure, such as the movable part 30 and the beam part 40, to vibrate. Specifically, the drive parts 50 include drive piezoelectric films 51 and drive wires 52 which are respectively provided on both ends of the individual drive beams 42 and the like.

Each of the drive piezoelectric films 51 is formed of a PZT (abbreviation for piezoelectric zirconate titanate) thin film or the like. A drive voltage applied to the drive piezoelectric film 51 via the drive wire 52 causes the drive piezoelectric film 51 to generate a force to vibrationally drive the sensor structure. The two drive piezoelectric films 51 are provided at both ends of each of the drive beams 42. The drive piezoelectric film 51 located closer to an outer edge of the sensor structure serves as an outer piezoelectric film 51a, while the drive piezoelectric film 51 located inwardly of the outer piezoelectric film 51a serves as an inner piezoelectric film 51b. The outer piezoelectric film 51a and the inner piezoelectric film 51b are provided to extend in the x-axis direction and formed to be arranged in parallel with each other at each of places where the outer and inner piezoelectric films 51a and 51b are disposed.

Each of the drive wires 52 is configured to apply the drive voltage to the outer piezoelectric film 51a or the inner piezoelectric film 51b. In the drawing, only portions of the drive wires 52 are shown, but are actually provided to extend from the drive beams 42 to the fixation parts 20 via the supporting member 43. The drive wires 52 are electrically connected to the outside via pads formed on the fixation parts 20 and not shown by wire bonding or the like. This allows the drive voltage to be applied to the outer piezoelectric film 51a or the inner piezoelectric film 51b through each of the drive wires 52.

Each of the detection parts 60 is a portion which outputs, as an electric signal, displacement of the detection beams 41 resulting from the application of the angular velocity to the vibration type angular velocity sensor. In the case of the present embodiment, the detection part 60 is formed on the first detection beam 41a of the detection beam 41 having an increased spring constant and configured to include detection piezoelectric films 61a to 61d, dummy piezoelectric films 62a to 62d, and a detection wire 63.

Each of the detection piezoelectric films 61a to 61d is formed of a PZT thin film or the like at a position on the first detection beam 41a where a tensile stress is applied when each of the first detection beams 41a is displaced by the application of the angular velocity. Specifically, the detection piezoelectric films 61a and 61d are disposed closer to the detection weights 35 and 36 on regions of the first detection beams 41a closer to both ends thereof, while the detection piezoelectric films 61b and 61c are disposed further away from the detection weights 35 and 36 on regions of the first detection beams 41a closer to the joint parts 41c.

Each of dummy piezoelectric films 62a to 62d is formed of a PZT thin film or the like and disposed symmetrically to the detection piezoelectric films 61a to 61d so as to maintain a symmetric property of each of the detection beams 41. In other words, each of the dummy piezoelectric films 62a to 62d is formed at a position on the first detection beam 41a where a compressive stress is applied when each of the first detection beams 41a is displaced by the application of the angular velocity. Specifically, the dummy piezoelectric films 62a and 62d are disposed closer to the detection weights 35 and 36 on the regions of the first detection beams 41a closer to the both ends thereof, while the dummy piezoelectric films 62b and 62c are disposed further away from the detection weights 35 and 36 on the regions of the first detection beams 41a closer to the joint parts 41c.

Both of the detection piezoelectric films 61a to 61d and the dummy piezoelectric films 62a to 62d are provided to extend in the y-axis direction and formed to be arranged in parallel at each of the locations where the detection piezoelectric films 61a to 61d and the dummy piezoelectric films 62a to 62d are disposed. Note that, in the example described herein, the detection piezoelectric films 61a to 61d are formed in portions where a tensile stress which maximizes the displacement is generated. However, the detection piezoelectric films 61a to 61d may be formed in portions where the compressive stress is generated or may also be formed in each of the portion where the tensile stress is generated and the portion where the compressive stress is generated.

For example, it may be possible that the detection piezoelectric films 61a to 61d are formed in a portion of the first detection beam 41a on the left side in the x-axis direction in FIG. 1 where the compressive stress is generated, while being formed in a portion of the first detection beam 41a on the right side in the x-axis direction in FIG. 1 where the tensile stress is generated, or vice versa.

The dummy piezoelectric films 62a to 62d need not necessarily be formed. It is appropriate that at least the detection piezoelectric films 61a to 61d are formed.

The detection wires 63 are connected to the detection piezoelectric films 61a to 61d to retrieve electric outputs from the detection piezoelectric films 61a to 61d resulting from the displacement of the detection beams 41. In the drawing, only portions of the detection wires 63 are illustrated, while illustration of the other portions thereof is omitted. However, the detection wires 63 are actually provided to extend from the inner drive weights 33 and 34 and the drive beams 42 to the fixation parts 20 through the supporting members 43. The detection wires 63 are electrically connected to the outside via pads formed on the fixation parts 20 and not shown by wire bonding or the like. This allows each of the detection parts 60 to be configured to be able to transmit changes in the electric outputs from the detection piezoelectric films 61a to 61d to the outside through the detection wires 63.

The structure as described above allows the vibration type angular velocity sensor to be configured to include an angular velocity detection structure pair including the two outer drive weights 31 and 32, the two inner drive weights 33 and 34, and the two detection weights 35 and 36. In addition, in the vibration type angular velocity sensor thus configured, an intended sensitivity is allowed to be obtained, as described later.

Next, a description will be given of the layout of the fixation parts 20 and the effect achieved thereby.

As shown in FIG. 1, in top view, the fixation parts 20 are disposed in a region between the two drive beams 42, i.e., the region of the area where the vibration type angular velocity sensor is formed which is closer to the center thereof than in the conventional sensor where fixation parts are disposed in regions outside of drive beams.

Specifically, the vibration type angular velocity sensor of the present embodiment includes the total of six fixation parts 20 including the three fixation parts 20 joined to the drive beam 42 on an upper side of the surface of the paper sheet with FIG. 1 via the supporting members 43 and the three fixation parts 20 joined to the drive beam 42 on a lower side of the surface of the paper sheet with FIG. 1 via the supporting members 43.

Note that, in the description given below, for the sake of convenience, the three fixation parts 20 connected to the drive beam 42 on the upper side of the surface of the paper sheet with FIG. 1 are assumed to be upper fixation parts, while the three fixation parts 20 connected to the drive beam 42 on the lower side of the surface of the paper sheet with FIG. 1 are assumed to be lower fixation parts.

As shown in FIG. 1, between the outer drive weight 31 and the inner drive weight 33, between the inner drive weights 33 and 34, and between the outer drive weight 32 and the inner drive weight 34, the upper and lower fixation parts are respectively disposed. The respective upper fixation parts are disposed to face the individual lower fixation parts. In the present embodiment, the individual upper fixation parts are disposed to be arranged in a straight line along a direction crossing the y-axis direction as the one direction of each of the plurality of weights 31 to 36, e.g., the x-axis direction. The lower fixation parts are also disposed to be arranged in a straight line along the x-axis direction different from the straight line in which the upper fixation parts are arranged, similarly to the upper fixation parts.

Also, in the present embodiment, the upper fixation parts are disposed such that respective distances between the individual upper fixation parts and the drive beam 42 joined thereto in the y-axis direction are equal. Similarly to the upper fixation parts, the lower fixation parts are disposed such that respective distances between the individual lower fixation parts and the drive beam 42 joined thereto in the y-axis direction are equal.

Note that the positional relationships between the upper fixation parts, between the lower fixation parts, and between the upper fixation parts and the lower fixation parts are not limited to those in the example described above, and design thereof may also be modified appropriately.

Thus, the vibration type angular velocity sensor of the present embodiment has a structure in which the fixation parts 20 are disposed closer to the center of the substrate 10, i.e., closer to the center of a region where the sensor structure is formed than in the conventional sensor in which the fixation parts are disposed outside the two drive beams. This is because, when heat or the like causes a strain in the substrate 10, the structure can reduce an amount of displacement of the fixation parts 20 resulting from the strain compared to that in the conventional sensor and suppress degradation of a temperature property and leakage vibration.

It is assumed herein that, when the fixation parts 20 are disposed in an outer peripheral region of the substrate 10 and when the fixation parts 20 are disposed in a center region of the substrate 10, respective strains are caused in the substrates 10. The following will specifically examine influences exerted by the respective strains on the movable parts 30.

An amount of displacement of the substrate 10 when heat or the like has caused a strain in the substrate 10 is generally larger on an outer peripheral side of the substrate than on a center side of the substrate and smaller on the center side of the substrate than on the outer peripheral side of the substrate. In other words, the influence of the strain in the substrate 10 on the fixation parts 20 is smaller when the fixation parts 20 are disposed on the center side of the substrate 10 than when the fixation parts 20 are disposed on the outer peripheral side of the substrate 10.

In the vibration type angular velocity sensor including the movable part supported by the fixation parts, when the substrate is strained by heat or the like, the strain displaces the fixation parts, and the displacement is transmitted to the movable part via the supporting members to degrade the temperature property. Accordingly, the vibration type angular velocity sensor is configured such that the fixation parts 20 are disposed in a region of the substrate 10 less affected by the substrate 10. As a result, in the vibration type angular velocity sensor, the degradation of the temperature property is more successfully suppressed than in the conventional vibration type angular velocity sensor.

The conventional vibration type angular velocity sensor is in a state in which the fixation parts are disposed in a portion of the substrate where the amount of displacement resulting from the strain in the substrate is large, i.e., where an initial strain is large. When vibrational driving is performed, the initial strain is further amplified. In other words, in the conventional vibration type angular velocity sensor, regardless of a state in which the vibrational driving is performed and no Coriolis force is applied, vibration which causes an angular velocity detection output, i.e., leakage vibration undesirably increases. Consequently, in the conventional vibration type angular velocity sensor, an unexpected detection output increases to possibly degrade the accuracy of detection of the angular velocity.

By contrast, in the vibration type angular velocity sensor of the present embodiment, the fixation parts 20 are disposed between the two drive beams 42, i.e., in a portion of the substrate 10 where the amount of displacement resulting from the strain in the substrate 10 is small, and consequently the vibration type angular velocity sensor of the present embodiment is in a state where the initial strain is small. Accordingly, the vibration type angular velocity sensor of the present embodiment has a structure in which, even when vibrational driving is performed, the leakage vibration is less likely to be amplified than in the conventional vibration type angular velocity sensor. This suppresses the unexpected detection output and increases the accuracy of detection of the angular velocity.

Note that the "leakage vibration" mentioned herein refers to unexpected vibration which causes the angular velocity detection output due to a strain resulting from a working error or working or the like in a state in which the vibrational driving is performed and no Coriolis force is applied.

Subsequently, a description will be given of an operation of the vibration type angular velocity sensor thus configured with reference to FIGS. 2 to 4.

First, referring to FIG. 2, a description will be given of the vibration type angular velocity sensor during a basic operation thereof. An intended drive voltage is applied to each of the drive parts 50 disposed at the both ends of each of the drive beams 42, and each of the drive weights 31 to 34 is vibrated in the y-axis direction based on the drive voltage.

Specifically, in the drive part 50 provided at the left end portion of the drive beam 42 on the upper side of the surface of the paper sheet, a tensile stress is generated by the outer piezoelectric film 51a, while a compressive stress is generated by the inner piezoelectric film 51b. Conversely, in the drive part 50 provided at the right end portion of the drive beam 42 on the upper side of the surface of the paper sheet, a compressive stress is generated by the outer piezoelectric film 51a, while a tensile stress is generated by the inner piezoelectric film 51b. This can be achieved by applying antiphase voltages to the outer piezoelectric films 51a or the inner piezoelectric films 51b of the drive parts 50 disposed on both left and right sides on the drive beam 42 on the upper side of the surface of the paper sheet.

On the other hand, in the drive part 50 provided at the left end portion of the drive beam 42 on the lower side of the surface of the paper sheet, a compressive stress is generated by the outer piezoelectric film 51a, while a tensile stress is generated by the inner piezoelectric film 51b. Conversely, in the drive part 50 provided at the right end portion of the drive beam 42 on the lower side of the surface of the paper sheet, a tensile stress is generated by the outer piezoelectric film 51a, while a compressive stress is generated by the inner piezoelectric film 51b. This can also be achieved by applying antiphase voltages to the outer piezoelectric films 51a or the inner piezoelectric films 51b of the drive parts 50 disposed on both left and right sides on the drive beam 42 on the lower side of the surface of the paper sheet.

Then, the respective voltages applied to the outer piezoelectric films 51a or the inner piezoelectric films 51b are controlled so as to change the respective stresses generated by the outer piezoelectric films 51a and the inner piezoelectric films 51b of the individual drive parts such that the tensile stresses are changed to the compressive stresses and the compressive stresses are changed to the tensile stresses. Then, such operations are repeated even thereafter at a predetermined drive frequency.

Figure 2:
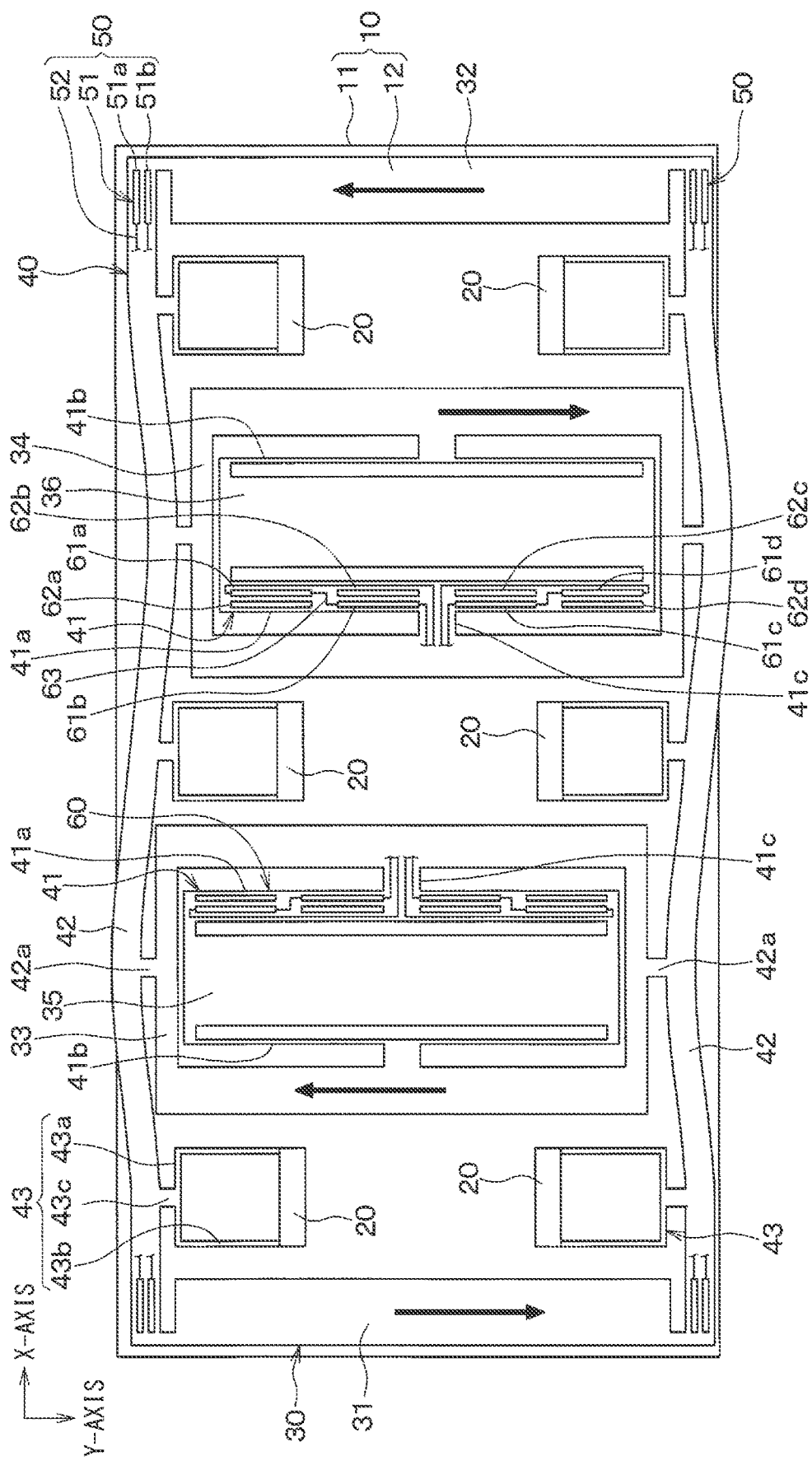
FIG. 2 is a schematic diagram showing the vibration type angular velocity sensor during a base operation thereof.
Figure 3:
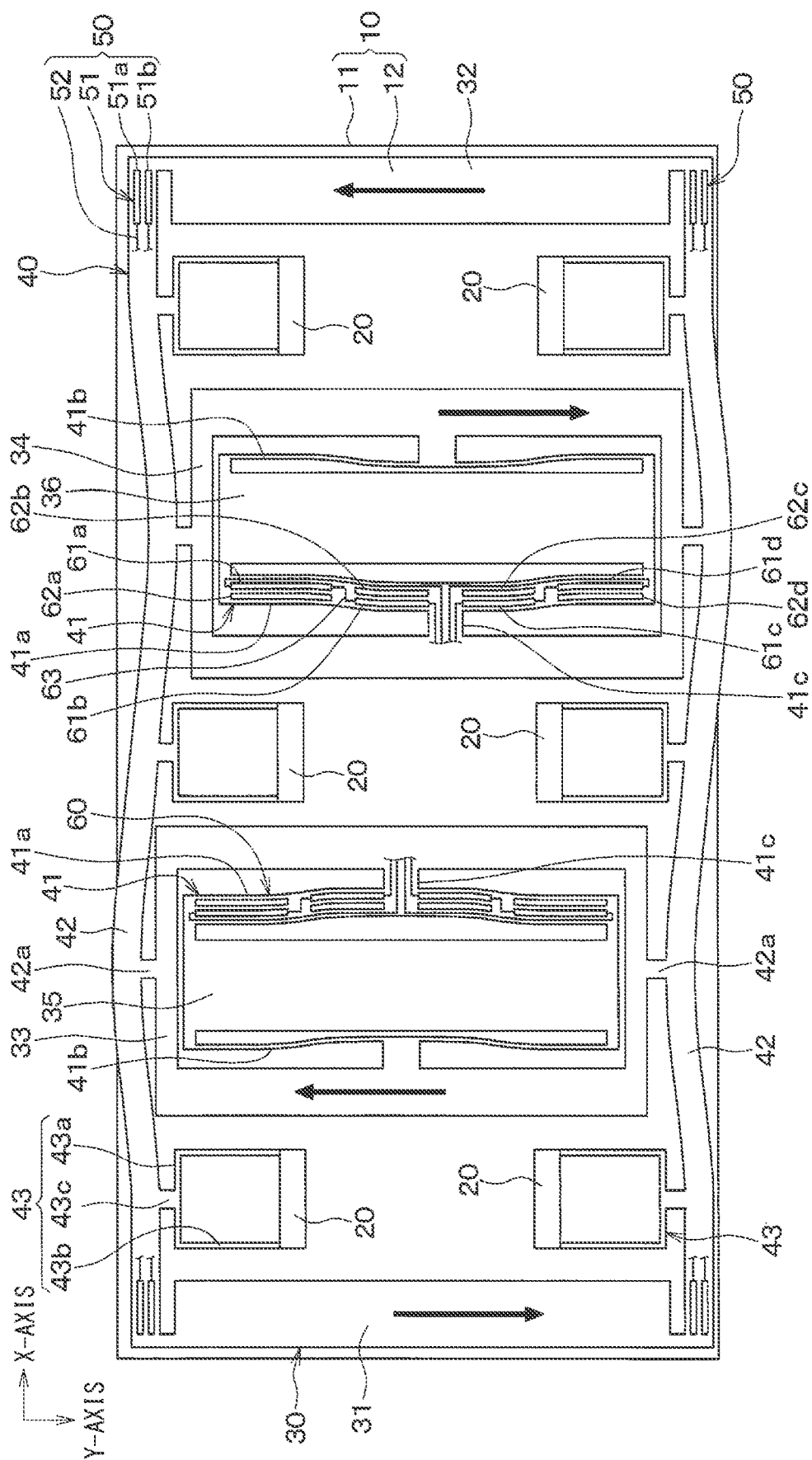
FIG. 3 is a schematic diagram showing the vibration type angular velocity sensor during an application of an angular velocity thereto.

As a result, as shown in FIG. 2, the outer drive weight 31 and the inner drive weight 33 are caused to vibrate in opposite phases in the y-axis direction. Also, the outer drive weight 32 and the inner drive weight 34 are caused to vibrate in opposite phases in the y-axis direction. In addition, the two inner drive weights 33 and 34 are caused to vibrate in opposite phases in the y-axis direction, while the two outer drive weights 31 and 32 are also caused to vibrate in opposite phases in the y-axis direction. Consequently, the vibration type angular velocity sensor is driven in a drive mode shape.

Note that, at this time, each of the drive beams 42 serpentines into the S-shape configuration to permit each of the weights 31 to 34 to move in the y-axis direction. However, the joint parts 43c connecting the rotating beams 43a and the drive beams 42 serve as amplitude nodes, i.e., fixed points and are scarcely displaced. When an impact or the like is applied, the supporting beams 43b are displaced to permit the individual weights 31 to 36 to move in the x-axis direction, reduce an output change caused by the impact, and allow impact resistance to be obtained.

Next, referring to FIG. 3, a description will be given of the vibration type angular velocity sensor when an angular velocity is applied thereto. While the vibration type angular velocity sensor is operating a basic operation as shown in FIG. 2 described above, when an angular velocity around a z-axis is applied thereto, the Coriolis force displaces the detection weights 35 and 36 in a direction crossing the y-axis, which is the x-axis direction herein, as shown in FIG. 3. Specifically, since the detection weights 35 and 36 and the inner drive weights 33 and 34 are connected via the detection beams 41, the detection weights 35 and 36 are displaced based on elastic deformation of the detection beams 41. Then, as a result of the elastic deformation of the detection beams 41, tensile stresses are applied to the detection piezoelectric films 61a to 61d provided on the first detection beams 41a. As a result, output voltages from the detection piezoelectric films 61a to 61d change in response to the tensile stresses applied thereto, and the changed output voltages are output to the outside through the detection wires 63. By reading the output voltages, it is possible to detect the applied angular velocity.

Figure 4:
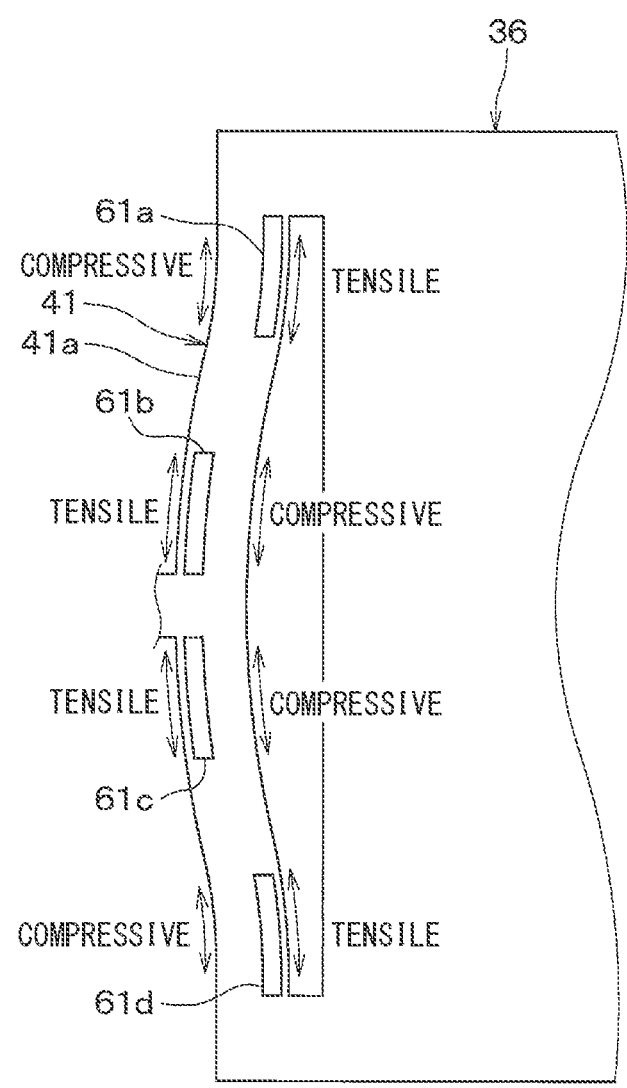
FIG. 4 is an enlarged view showing displacement of a first detection beam in FIG. 3.

In particular, since the detection piezoelectric films 61a to 61d are disposed in the vicinities of the portions of the detection beams 41 which are joined to the detection weights 35 and 36 and joined to the inner drive weights 33 and 34, largest tensile stresses are applied to the detection piezoelectric films 61a to 61d, as shown in FIG. 4. This allows the output voltages from the detection piezoelectric films 61a to 61d to be further increased.

In this case, since each of the detection beams 41 includes the first detection beam 41a and the second detection beam 41b which have the different spring constants in the present embodiment, an effect as shown below can be obtained.

The first detection beam 41a and the second detection beam 41b are configured to have the different spring constants, and the dimension of the first detection beam 41a in the x-axis direction is increased. When the dimension of the first detection beam 41a in the x-axis direction is thus increased, the formed detection piezoelectric films 61a to 61d occupy a larger area. Accordingly, it is possible to increase the changes in the output voltages from the detection piezoelectric films 61a to 61d responding to the displacement of the first detection beams 41a. This allows the sensitivity of the vibration type angular velocity sensor to be improved.

However, when the spring constant of each of the first detection beams 41a is increased, it is concerned that a frequency (hereinafter referred to as the detection vibration frequency) of the displacement of each of the detection weights 35 and 36 during the application of the angular velocity is excessively increased. Accordingly, the first detection beam 41a and the second detection beams 41b are configured to have the different spring constants, and the dimension of the first detection beam 41a in the x-axis direction is increased, while a dimension of the second detection beam 41b in the x-axis direction is reduced.

As a result, even though the spring constant of the first detection beam 41a is increased, since the respective spring constants of both of the first detection beam 41a and the second detection beam 41b are not increased, it is possible to ensure ease of displacement of the detection weights 35 and 36. In addition, it is possible to allow the detection vibration frequency to fall in an intended frequency band and suppress the detection vibration frequency from being excessively increased.

According to the present embodiment, the fixation parts 20 which fix the drive beams 42 via the supporting members 43 are disposed in the region between the two drive beams 42, i.e., the center-side region of the substrate 10 less affected by the strain in the substrate 10 than the outer-peripheral-side region thereof. Consequently, even though the substrate 10 is strained by heat or the like, the amounts of displacement of the fixation parts 20 resulting from the strain in the substrate 10 and the resultant influence on the movable part 30 are smaller than in the conventional sensor in which the fixation parts are disposed in the region outside the two drive beams, i.e., the outer-peripheral-side region of the substrate 10. What results is the vibration type angular velocity sensor in which the degradation of the temperature property of the movable part 30 supported by the fixation parts 20 and the occurrence of the leakage vibration are more successfully suppressed than in the conventional sensor and which has improved vibration damping performance and improved robustness against the strain in the substrate 10 compared to those in the conventional sensor.

In addition, since the locations of the fixation parts 20 are changed from the outside of the two drive beams 42 to the inside thereof, a size of the entire sensor structure can accordingly be reduced, resulting in the vibration type angular velocity sensor which is smaller in size than the conventional sensor.

Second Embodiment

Figure 5:
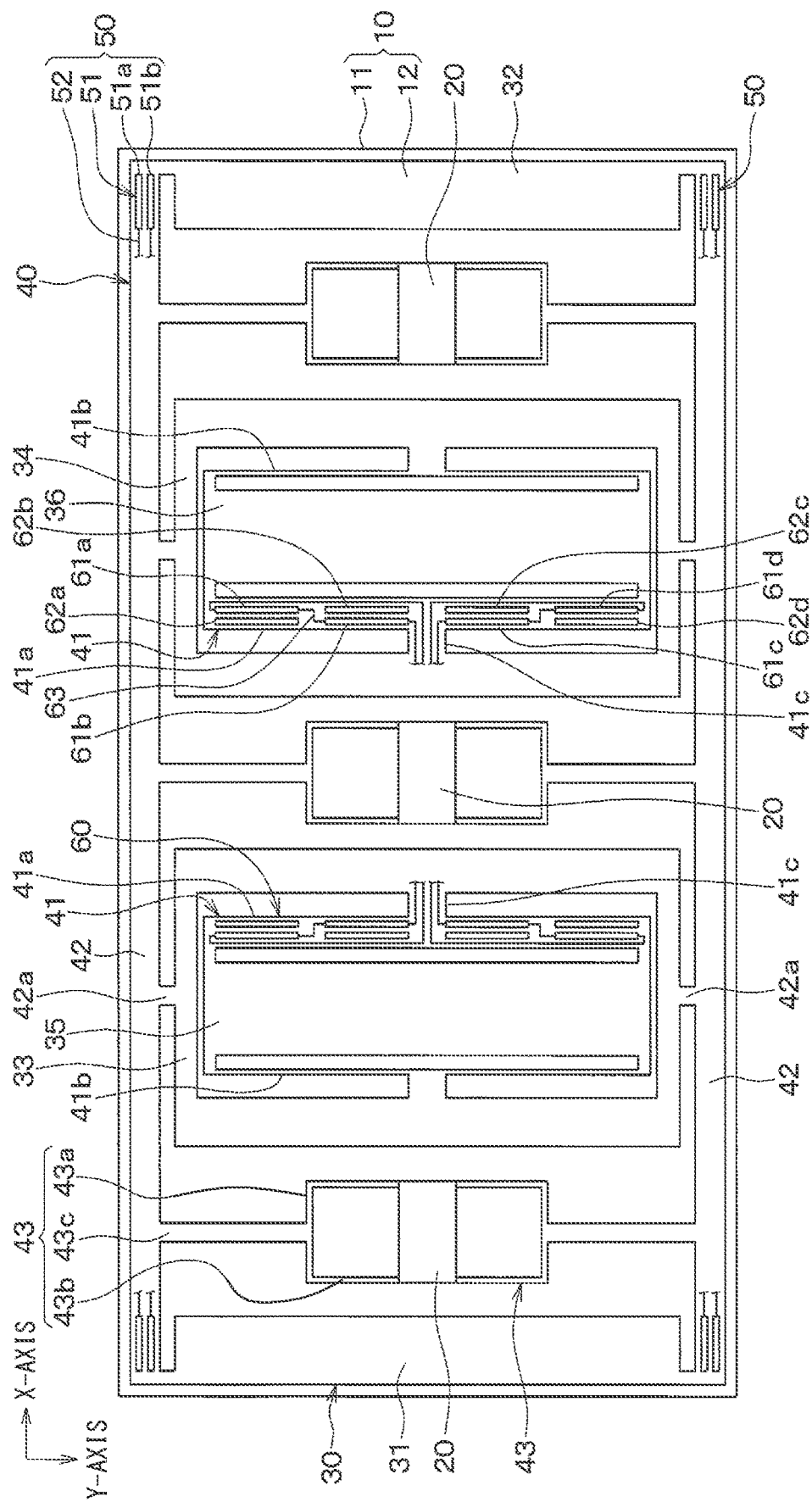
FIG. 5 is a schematic plan view showing a vibration type angular velocity sensor of a second embodiment.

Referring to FIG. 5, a description will be given of a vibration type angular velocity sensor of the second embodiment.

As shown in FIG. 5, in the vibration type angular velocity sensor of the present embodiment, between the outer drive weight 31 and the inner drive weight 33, between the inner drive weights 33 and 34, and between the outer drive weight 32 and the inner drive weight 34, the total of three fixation parts 20 are individually disposed. Each of the fixation parts 20 is connected to the two drive beams 42 via the supporting members 43. In the point described above, the vibration type angular velocity sensor of the present embodiment is different from that of the first embodiment described above. In the present embodiment, a description will be given mainly of the different portion.

As shown in FIG. 5, the individual fixation parts 20 are disposed at respective middle positions in the y-axis direction between the outer drive weight 31 and the inner drive weight 33, between the inner drive weights 33 and 34, and between the outer drive weight 32 and the inner drive weight 34. The three fixation parts 20 are disposed to be arranged in a straight line along the x-axis direction.

Each of the fixation parts 20 is connected to the two supporting members 43 to join the two drive beams 42 together via the supporting members 43. Also, each of the fixation parts 20 is disposed such that a distance between the fixation part 20 and one of the two drive beams 42 in the y-axis direction as the one direction of each of the plurality of weights 31 to 36 is equal to a distance between the fixation part 20 and the other of the two drive beams 42 in the y-axis direction.

In other words, in the region between the two drive beams 42, the fixation part 20 formed between the outer drive weight 31 and the inner drive weight 33 is only one, the fixation part 20 formed between the inner drive weights 33 and 34 is only one, and the fixation part 20 formed between the outer drive weight 32 and the inner drive weight 34 is only one. Each of the fixation parts 20 supports the two drive beams 42 via the supporting members 43 to function as a supporting fixation part shared by the two drive beams 42. Accordingly, the vibration type angular velocity sensor of the present embodiment has a structure in which each of the fixation parts 20 is disposed at the middle position on the substrate 10 in the y-axis direction where the fixation part 20 is least affected by a strain.

In the present embodiment, each of the supporting members 43 is configured such that the joint part 43c has a dimension in the y-axis direction which is longer than in the first embodiment described above, while the rotating beam 43a and the supporting beam 43b have respective dimensions in the y-axis direction which are the same as those in the first embodiment described above. However, the configuration of the supporting member 43 is not limited to that in the example described above, and design thereof may also be modified appropriately.

The vibration type angular velocity sensor in the present embodiment is configured such that the fixation parts 20 are disposed closer to the center of the substrate 10 than in the first embodiment described above. As a result, even though the substrate 10 is strained by heat or the like, the amounts of displacement of the fixation parts 20 are further reduced compared to those in the first embodiment described above. This suppresses the degradation of the temperature property due to the strain in the substrate 10 and the leakage vibration and improves the accuracy of detection of the angular velocity.

Also, in the vibration type angular velocity sensor of the present embodiment, the fixation parts 20 are disposed at the middle positions in the y-axis direction between the two drive beams 42 to thus further reduce the initial strain compared to that in the first embodiment described above. As a result, in the vibration type angular velocity sensor of the present embodiment, the leakage vibration is further reduced to suppress the unexpected detection output and provide a structure which detects the angular velocity with higher accuracy.

The present embodiment provides the vibration type angular velocity sensor in which the degradation of the temperature property of the movable part 30 supported by the fixation parts 20 and the leakage vibration are more successfully suppressed than in the first embodiment described above. The vibration type angular velocity sensor according to the present embodiment also has improved vibration damping performance and improved robustness against the strain in the substrate 10 compared to those in the first embodiment described. In addition, for the same reason as given above in the first embodiment, the vibration type angular velocity sensor according to the present embodiment is smaller in size than the conventional sensor.

Other Embodiments

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

(1) For example, in the example described in each of the foregoing embodiments, the vibration type angular velocity sensor is provided as the piezoelectric type gyroscope sensor. However, the vibration type angular velocity sensor may also be provided as an electrostatic type gyroscope sensor as long as a configuration thereof is such that the fixation parts 20 are disposed between the two drive beams 42.

Specifically, when the vibration type angular velocity sensor is provided as the electrostatic type sensor, each of the drive parts 50 is configured such that, e.g., an indented driving movable electrode is formed on each of driving fixation parts, the inner drive weights 33 and 34, and the outer drive weights 31 and 32 which are formed on the substrate 10. By generating an electrostatic attractive force in the electrode, it is possible to vibrationally drive the movable part 30 without using the drive piezoelectric films 51. On the other hand, each of the detection parts 60 is configured such that, e.g., each of the detection weights 35 and 36 is formed in a frame body shape, while detecting fixation parts are provided in a region of the substrate located inside the detection weights and an indented electrode is provided on each of the detection weights 35 and 36 and detecting fixation parts. When the movable part 30 is vibrationally driven, by measuring the displacement of the detection part 60 in a direction perpendicular to a direction of the vibrational driving when the Coriolis force is applied, it is possible to detect an angular velocity. Such an electrostatic sensor is also configured such that the fixation parts 20 are disposed between the two drive beams 42 to result in a vibration type angular velocity sensor in which the displacement of the fixation parts 20 resulting from a strain in the substrate is suppressed and which has improved vibration damping performance and improved robustness against the strain in the substrate.

(2) In the example described in each of the foregoing embodiments, the fixation parts 20 are disposed in a straight line in the x-axis direction which is perpendicular to the one direction of each of the plurality of weights 31 to 36, i.e., the y-axis direction in FIG. 1. However, when disposed between the two drive beams 42, the fixation parts 20 more successfully function to suppress the degradation of the temperature property of the movable part 30 and the leakage vibration than in the conventional sensor. Accordingly, the fixation parts 20 need not necessarily be disposed in a straight line. When the fixation parts 20 are disposed in a straight line, the fixation parts 20 may also be disposed in a straight line in one of the directions crossing the one direction of each of the plurality of weights 31 to 36 which is other than the perpendicular direction.

Also, in the example described in each of the foregoing embodiments, the one direction of each of the plurality of weights 31 to 36 is a longitudinal direction of each of the plurality of weights 31 to 36. However, the one direction need not necessarily be the longitudinal direction. For example, even in such a case where each of the plurality of weights 31 to 36 is formed in a square shape, it is appropriate that the plurality of weights 31 to 36 are interposed between the two drive beams 42 at one ends thereof in the one direction and at the other ends thereof in the one direction, and the fixation parts 20 are disposed between the two drive beams 42.

(3) In the example described in each of the foregoing embodiments, the vibration type angular velocity sensor is configured as a so-called yaw gyroscope sensor which is driven in a plane to detect an angular velocity of rotation performed around a direction normal to the plane. However, the vibration type angular velocity sensor is not limited thereto and may also be configured as a rollover gyroscope sensor. Thus, the vibration type angular velocity sensor according to the present disclosure is appropriate as long as the fixation parts 20 are formed in the region between the two drive beams 42, i.e., the center-side region of the substrate 10 less affected by the strain in the substrate 10, and design of the other components may also be modified appropriately.

What is claimed is:
1. A vibration type angular velocity sensor, which detects an angular velocity, comprising:
a substrate having a surface;
a plurality of fixation parts disposed on the surface of the substrate;
a plurality of weights disposed to be spaced apart from the surface of the substrate, and disposed to be spaced apart from each other;
two linear drive beams disposed to be spaced apart from the surface of the substrate, the two linear drive beams disposed at opposite ends of the plurality of weights in one direction such that the plurality of weights are located between the two linear drive beams, the two linear drive beams connected to each other through the plurality of weights;
a plurality of supporting members joining the fixation parts to the drive beams;
a drive part configured to drive the drive beams to vibrate; and
a detection part configured to generate an electric output according to displacement of the weights caused by an angular velocity applied thereto while the drive beams are being driven to vibrate,
wherein the plurality of weights include
a pair of detection weights,
a pair of inner drive weights each surrounding a periphery of corresponding one of the pair of detection weights and joined to the corresponding one of the pair of detection weights, and
a pair of outer drive weights disposed on opposite sides of the pair of inner drive weights, and
wherein the fixation parts includes a first fixation part that is located between the two drive beams and between the pair of inner drive weights, a second fixation part that is located between the two drive beams and between one of the pair of inner drive weights and one of the pair of the outer drive weights, and a third fixation part that is located between the two drive beams and between the other of the pair of the inner drive weights and the other of the pair of the outer drive weights, when viewed in a direction normal to the surface of the substrate.

2. The vibration type angular velocity sensor according to claim 1,
wherein the first fixation part, the second fixation part and the third fixation part are arranged on a straight line along a direction crossing the one direction.

3. The vibration type angular velocity sensor according to claim 1,
wherein the fixation parts are disposed at middle positions in the one direction between the two drive beams and joined to the two drive beams through the supporting members.

4. The vibration type angular velocity sensor according to claim 1,
wherein the fixation parts are each disposed such that a distance between the fixation part and one of the two drive beams in the one direction is equal to a distance between the fixation part and the other of the two drive beams in the one direction.

5. The vibration type angular velocity sensor according to claim 1,
wherein the two linear drive beams extend in an extension direction perpendicular to the one direction, and
wherein the pair of detection weights, the pair of inner drive weights and the pair of outer drive weights are arranged in the extension direction of the two linear drive beams.

6. The vibration type angular velocity sensor according to claim 1, wherein the drive part is disposed at each of the drive beams, and wherein the detection part is disposed at a detection beam that is coupled to each of the pair of detection weights and corresponding one of the pair of the inner drive weights.

\* \* \* \* \*